(12) United States Patent
Venkata

(10) Patent No.: US 10,811,061 B1
(45) Date of Patent: Oct. 20, 2020

(54) REDUCED DIE SIZE AND IMPROVED MEMORY CELL RESTORE USING SHARED COMMON SOURCE DRIVER

(71) Applicant: Micron Technology, Inc., Boise, ID (US)

(72) Inventor: Harish N. Venkata, Allen, TX (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/540,873

(22) Filed: Aug. 14, 2019

(51) Int. Cl.
  *G11C 7/00* (2006.01)
  *G11C 7/08* (2006.01)
  *G11C 7/10* (2006.01)
  *G11C 11/4091* (2006.01)

(52) U.S. Cl.
  CPC .............. *G11C 7/08* (2013.01); *G11C 7/1063* (2013.01); *G11C 7/1069* (2013.01); *G11C 11/4091* (2013.01)

(58) Field of Classification Search
  CPC ....... G11C 7/08; G11C 7/1063; G11C 7/1069; G11C 11/4091
  See application file for complete search history.

(56) References Cited

U.S. PATENT DOCUMENTS

| | | | | |
|---|---|---|---|---|
| 6,914,837 B2* | 7/2005 | Schroeder | ................ | G11C 7/06 365/205 |
| 9,202,531 B2* | 12/2015 | Seo | ..................... | G11C 11/4091 |
| 9,773,544 B2* | 9/2017 | Woo | ..................... | G11C 11/4091 |
| 2010/0277964 A1* | 11/2010 | Shirley | ................ | G11C 7/1042 365/51 |

OTHER PUBLICATIONS

U.S. Appl. No. 16/137,175, filed Sep. 20, 2018, Shinichi Miyatake.

* cited by examiner

*Primary Examiner* — Toan K Le
(74) *Attorney, Agent, or Firm* — Fletcher Yoder, P.C.

(57) ABSTRACT

Memory devices may employ flip-flops with paired transistors in sense amplifying circuitry to sense charges stored in memory cells to perform read and/or activate operations. Sense amplifying circuitry may employ driving devices in driving circuitry to latch the read memory to a high or low voltage. Embodiments include systems and methods that facilitate reduced memory devices with faster memory cell restore by sharing the driving circuitry in different sense amplifying modules. Embodiments may employ switching circuitry in the sense amplifying circuitry to prevent unintentional or faulty readouts.

20 Claims, 6 Drawing Sheets

US 10,811,061 B1

REDUCED DIE SIZE AND IMPROVED MEMORY CELL RESTORE USING SHARED COMMON SOURCE DRIVER

BACKGROUND

1. Field of the Present Disclosure

This disclosure relates to memory devices, and more specifically, to sense amplifier circuitry with shared common source drivers.

2. Description of Related Art

Memory devices, such as random access memory (RAM) devices, dynamic RAM devices (DRAMs), static RAM devices (SRAMs), or flash memories, are often used in electronic systems to provide memory functionality that facilitates data processing operations and/or facilitates data storage during data processing operations. To that end, these memory devices may have addressable memory elements that may be arranged in memory arrays and/or banks. These memory devices may also include an input/output (I/O) interface that provides data access between memory elements and processing circuitry (e.g., a processor, a microcontroller, a system-on-chip). The I/O interface of the memory device may be coupled to the memory elements through internal data paths that may include circuitry for reading or writing data bits in the memory elements.

The memory elements may include a component, such as a capacitor, that may store a charge associated with a bit stored in the memory cell. In order to read the charge in the memory cell component, the component may be coupled to circuitry that can detect the stored charge. Sense amplify (SA) circuitry, for example, may be coupled to the memory cell arrays or memory cell components to detect the stored charge and to drive an output to a voltage associated with the stored charge. Increases in the amount of data capacity, increases in the speed of data transfers, and increase in the number of bits transferred per read and/or write operation may lead to increases in power specifications and/or reduction in the dimensions of memory devices and components, including in the SA circuitry. Improvements to the sensitivity and power consumption of SA circuitry, thus, may allow evolution in the performance of memory devices.

BRIEF DESCRIPTION OF THE DRAWINGS

Various aspects of this disclosure may be better understood upon reading the following detailed description and upon reference to the drawings in which.

DETAILED DESCRIPTION

Figure 1:
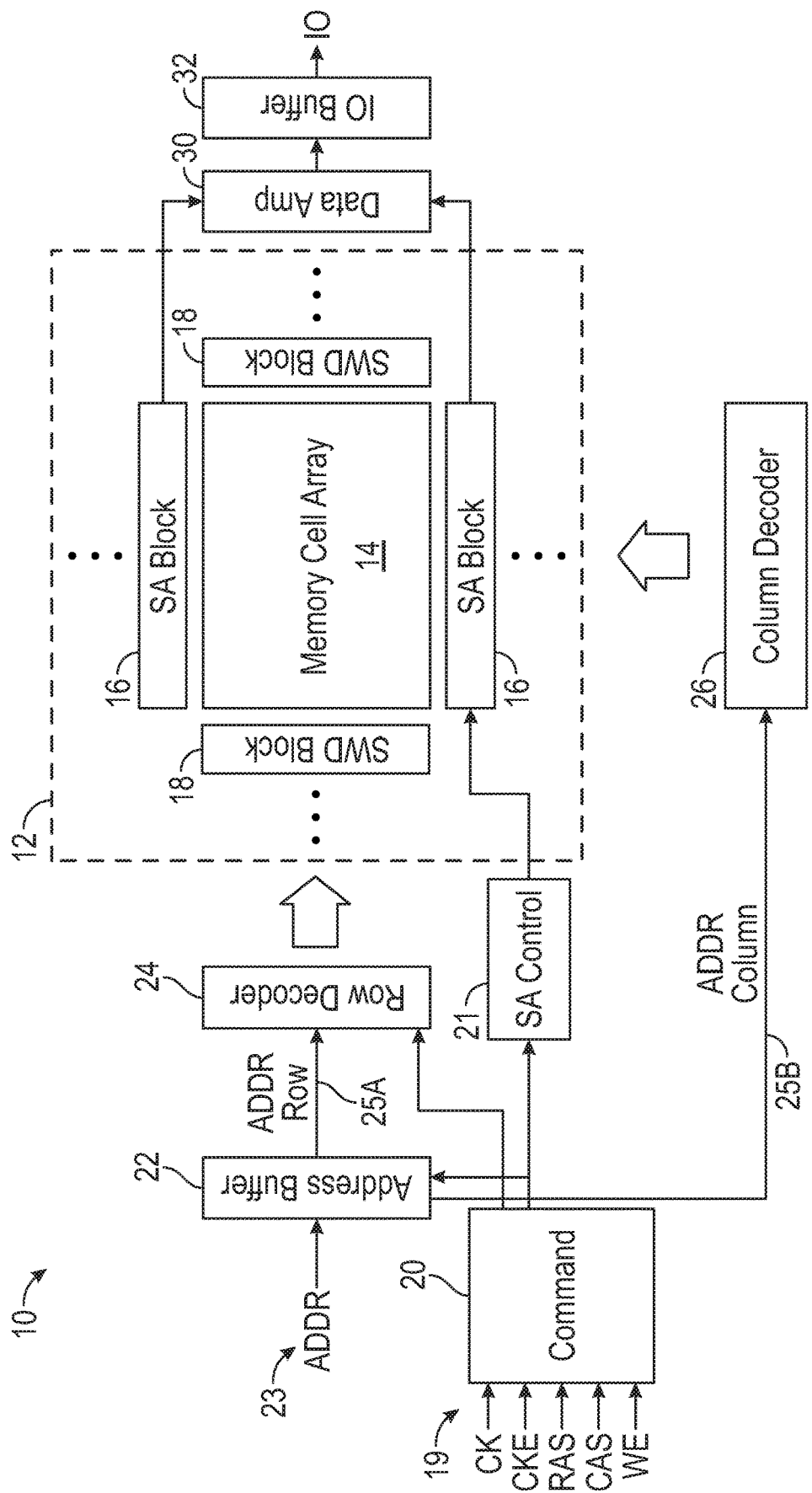
FIG. 1 is a block diagram of a memory device, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort may be complex and time consuming, but would nevertheless be a routine undertaking of design, fabrication, and manufacture for those of ordinary skill having the benefit of this disclosure.

Many electronic systems may employ memory devices to provide data storage functionalities and/or to facilitate the performance of data processing operations. Several memory devices may store data using addressable memory elements (e.g., memory cells), which may be disposed in memory banks or memory cell arrays. Examples of addressable memory devices include random access memories (RAMs) devices, dynamic RAM (DRAMs) devices, static RAM (SRAMs) devices, and/or flash memory devices, among others. Processing circuitry in the electronic systems may access (e.g., read/write) the memory elements by interacting with an input/output (I/O) interface and a command interface. As an example, a processor may read stored information from a particular memory element of the memory device by providing a read command and/or an address via the command interface, and retrieve the requested information (e.g., data bits) via the I/O interface.

The memory elements may store the data bits in a component that can hold a charge, such as a capacitor. For example, during a write process, a capacitor of a memory element may be configured to store a first voltage (e.g., 1V, 0.5V) associated with a first bit (e.g., TRUE) or a second voltage (e.g., 0V, −1V, −0.5V) associated with a second bit (e.g., FALSE). In order to read the stored voltage, the memory device may employ circuitry capable of sensing the stored voltage. For example, certain devices may employ a sense amplifier (SA) circuit that is capable of sensing the charge in the memory element and of latching the sensed charge in a data line.

The SA circuit may be coupled to driving circuitry (i.e., pull-up or pull-down circuitry) to perform, among other things, the latching of the sensed charge. As the number of bits per read and/or write operation increases, the power specifications of the active SA circuit that perform the read out may increase. To satisfy the increased power requirements, the floorplan resources used by transistors associated with the driving circuitry function may increase. The embodiments described herein are related to electrical configurations that allow sharing of the driving circuitry (i.e., pull-up or pull-down circuitry) of SA circuitry that may couple the data lines to the common source devices. This shared-driver architecture may allow a smaller floorplan for the memory bank by decreasing the dimensions of the individual drivers, as detailed below. The embodiments described herein may share the driving circuitries of an active SA circuit (i.e., SA circuit coupled to an activated memory cell) and one or more idle SA circuits (i.e., SA circuit coupled to a non-activated memory cell), as detailed below. The reduced dimensions and/or the sharing of the driving circuitries may improve memory cell restore.

The embodiments described herein may employ switching circuitry to prevent the idle SA circuits from affecting readouts from the memory bank, as detailed below. In some embodiments of memory devices, the SA circuits may include flip-flops formed from cross-coupled transistors. Specifically, the transistors may be metal-oxide semiconductor field electric transistors (MOSFETs), such as N-type MOSFETs (NMOS), and P-type MOSFETs (PMOS). Different types of transistors may be arranged in pairs (i.e., pairs of NMOS transistors and/or pairs of PMOS transistors) within the flip-flop to sense the difference between data-line pairs that sense the charge in the memory cell. Different MOSFET transistors may present different electrical characteristics (e.g., gate-source threshold voltage (Vth). To prevent biasing towards a particular voltage, the above-discussed switching circuitry may be employed to provide compensation for the bias (e.g., Vt compensation) in active SA circuits. As such, in some embodiments, the switching circuitry may perform the role of Vt compensation and the role of preventing faulty readouts in SA circuits with shared driving circuitry.

With the foregoing in mind, FIG. 1 is a block diagram of a DRAM device 10, in accordance with an embodiment of the present invention. The DRAM device may have memory banks 12, which may include one or more memory cell arrays 14. Each memory cell array 14 may be coupled to one or more sense amplifier (SA) blocks 16. The SA blocks 16 may include SA circuits that may facilitate read and/or write operations, such as the ones described in detail herein. The memory cell array 14 may also be coupled to subword driver (SWD) blocks 18. The SWD blocks 18 may facilitate read and write operations by providing voltages that may activate rows or columns of memory cells in the memory cell array 14.

Memory banks 12 may be controlled by clock and/or command signals 19, which may be received by a command block 20. Command block 20 may decode the clock and/or command signals 19 to generate various inner control signals to control internal circuitry, such as address buffers 22, decoders such as row decoder 24 and column decoder 26, SA control block 21, data amplifier 30, and input/output (I/O) buffer 32. For example, based on the clock and/or command signals 19, the command block 20 may provide commands to an SA control block 21. The SA control block 21 may provide commands to the SA blocks 16, including, among other commands, pre-charge commands, writing commands, and reading commands. The address buffer 22 may receive address signal 23. The clock and/or command signals 19 and the address signal 23 may be provided by processing circuitry coupled to the memory device, as discussed above.

The address signal 23 may be received by the address buffer 22 as a row address 25A and a column address 25B. The row address 25A may be provided to a row decoder 24 and the column address 25B may be provided to a column decoder 26. The row decoder 24 and the column decoder 26 may be used to control the appropriate SWD block 18 and SA block 16, respectively, to activate the memory cells associated with the requested address signal 23. For example, in a read and/or activate operation, the memory cells associated with the row address 25A and the column address 25B may be activated by a SWD block 18 to generate a read data signal through the SA block 16. A data amplifier 30 and I/O buffer 32 may receive the read data signal from the SA block 16, amplify the read data signal, and transport the read data to an external device.

Figure 2:
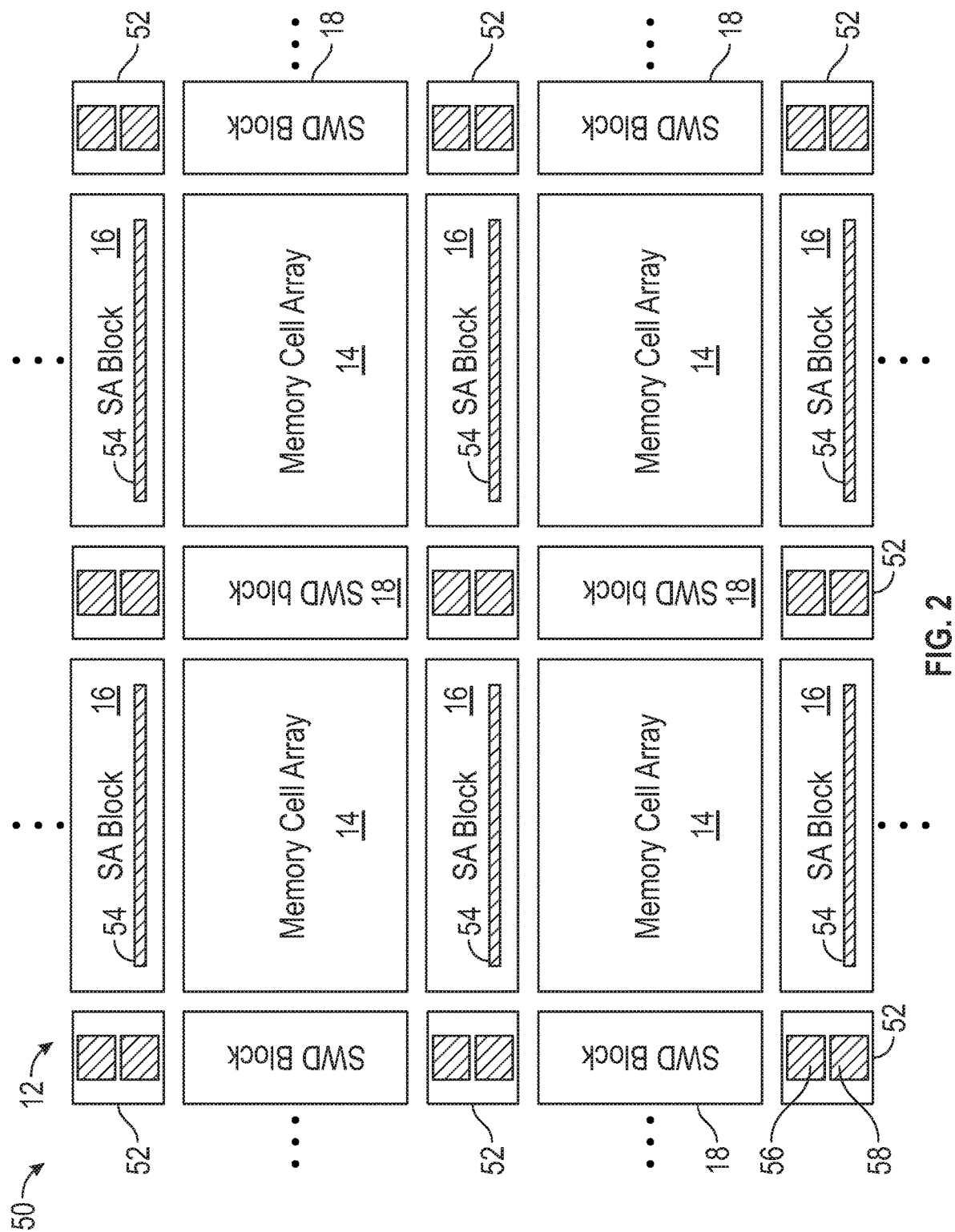
FIG. 2 is a diagram illustrating one arrangement for components of the circuitry in the memory bank of a memory device, in accordance with an embodiment.

The block diagram 50 of FIG. 2 illustrates a potential arrangement for a memory bank with shared circuitry, as discussed herein. Specifically, the block diagram 50 shows an example of layout positions of memory cell arrays 14, SA blocks 16, and SWD blocks 18 within a memory bank 12. The block diagram 50 also illustrates circuit blocks 52 that may be located at crossing points between the SA blocks 16 and SWD blocks 18. In the illustrated system, SA blocks 16 may include SA stripes 54. In general, an SA stripe 54 may include one or more SA circuits, and each SA circuit may be associated with a row. The circuit blocks 52 may have equalization devices 56 for read and write and/or common source pull-up and/or pull-down devices 58 that may drive SA blocks 16 and SWD blocks 18.

Conventionally, an increase in the amount of data accessed by a memory device may lead to an increase in the size of the devices 56 and 58 in the circuit blocks 52, and in the size of the SA stripe 54, as discussed above. For example, the double-data rate 5 (DDR5) standard may employ 16 datawords per memory read (i.e., 16n prefetch) whereas the double-data rate 4 (DDR4) standard may employ 8 datawords per memory read (i.e., 8n prefetch). The doubling in the data accessed per read could lead to an increase of 2 to 3 fingers in the dimensions of the SA stripe 54 and to the doubling in the number of common source pull-up and/or pull-down devices 58, leading to an increase in the area of the memory device die. Moreover, the cell restore timing could also increase due to the increase in the dimensions of the circuitry. In the embodiments described herein, different SA stripes 54 in distinct SA blocks 16 may share the connection to a common source pull-up and/or pull-down device 58. Such sharing would provide additional driving power for each SA stripe 54 without significant increase in the number or size of the pull-up and/or pull-down devices 58.

Figure 3:
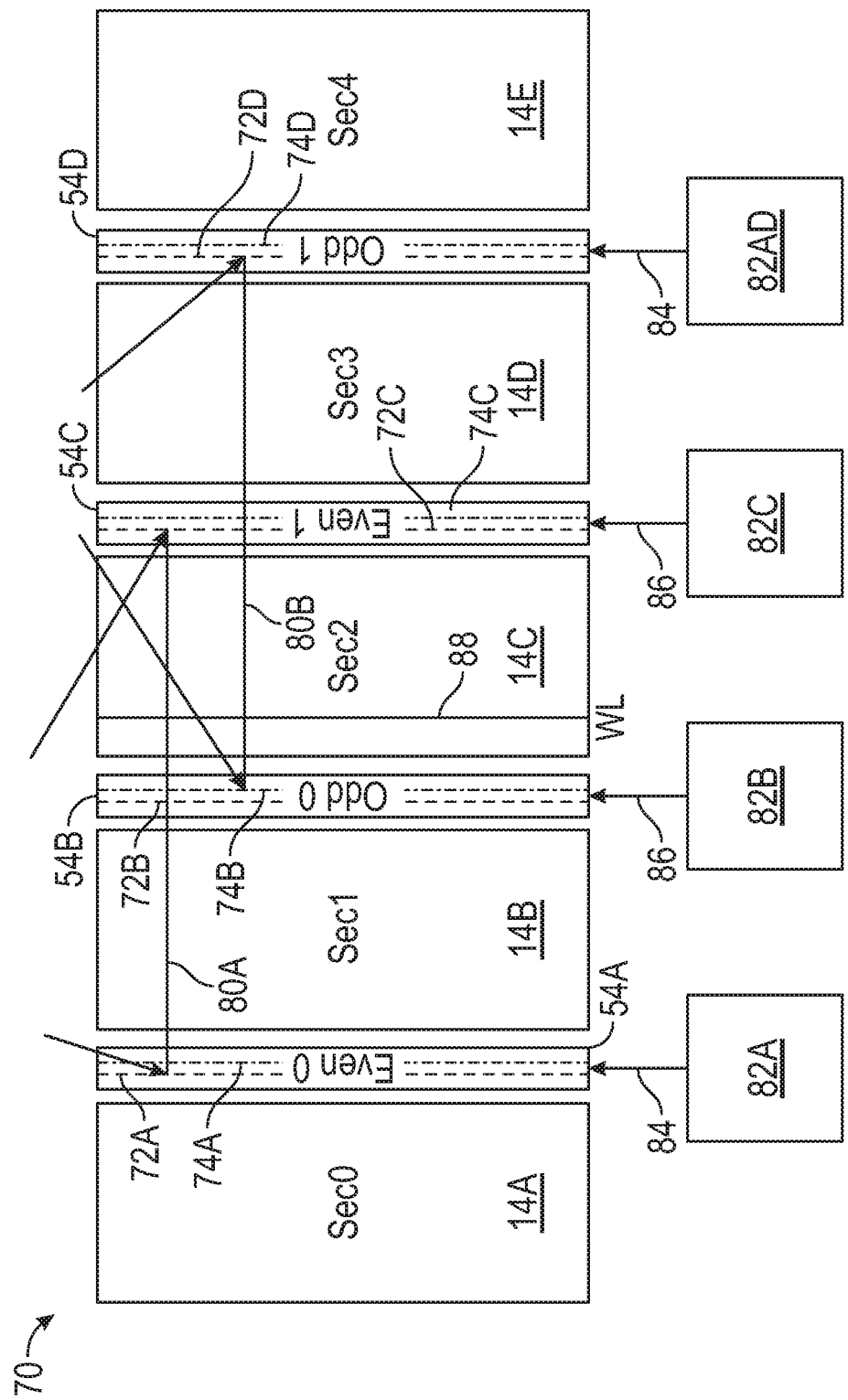
FIG. 3 is a diagram illustrating an arrangement for a memory bank having shared pull-up circuitry, in accordance with an embodiment.

FIG. 3 is a block diagram 70 of a portion of a memory bank that has a shared common source pull-up connection. The block diagram 70 has memory banks 14A, 14B, 14C, 14D, and 14E that are coupled to adjacent SA stripes 54A, 54B, 54C, and 54D. Memory banks 14A, 14B, 14C, 14D, and 14E are also coupled to SWD blocks, which are omitted in the diagram for clarity. In the illustrated system, each SA stripe (e.g., SA stripes 54A, 54B, 54C, and 54E) may include a pull-up sense amplifier p-channel common source (SAPCS) line, SAPCS lines 72A, 72B, 72C, and 72D) and a pull-down sense amplifier n-channel common source line (e.g., SANCS lines 74A, 74B, 74C, and 74D). In FIG. 3, the drivers of pull-up lines from different SA stripes may be shared. To that end, a connection 80A may couple the SAPCS line 72A of the SA stripe 54A to the SAPCS line 72C of the SA stripe 54C. Similarly, a connection 80B may couple the SAPCS line 72B of the SA stripe 54B to the SAPCS line 72D of the SA stripe 54D. As a result, the pull-up lines 72A and 72C are activated together and the power is provided by the driving circuitries (e.g., transistors devices) in both SA stripes 54A and 54C, and the pull-up lines 72B and 72D are activated together and the power is provided by the driving circuitries (e.g., transistor devices) in both SA stripes 54B and 54D.

In general, a single memory bank (e.g., memory banks 14A, 14B, 14C, 14D, or 14E) is active during an activate operation. In the illustrated system, data row 88 in memory bank 14C is being activated for an activate operation by SWD circuitry (not illustrated), as an example. In such a situation, the adjacent SA stripes (i.e., active SA circuit) may be activated to read data from the active memory bank. In this example, the pull-up lines 72B and 72C may be activated to enable SA circuitry in SA stripes 54B and 54C. However, as discussed above, pull-up lines 72A and 72D may be activated due to the presence of connections 80A and 80B, respectively.

To prevent the SA stripes 54A and 54D, which are not adjacent to the active memory bank (i.e., idle SA circuit), from generating undesired output, switching circuitry within the SA stripes 54A and 54D may be used to disconnect the SA amplifiers from the data lines. To coordinate the switching circuitry and the pull-up circuitry in this system, control logic may be used. In the illustrated example, logic blocks 82A, 82B, 82C, and 82D control the SA stripes 54A, 54B, 54C, and 54D, respectively. Control command 84 may be provided to switching circuitry in SA stripes 54A and 54D to disconnect the SA amplifiers from the data lines, whereas control command 86 may be provided to switching circuitry in stripes 54B and 54C to connect the SA amplifiers from the data lines. It should be understood that the illustrated logic blocks may be implemented by multiple independent logic circuits or by a single logic circuit.

Figure 4:
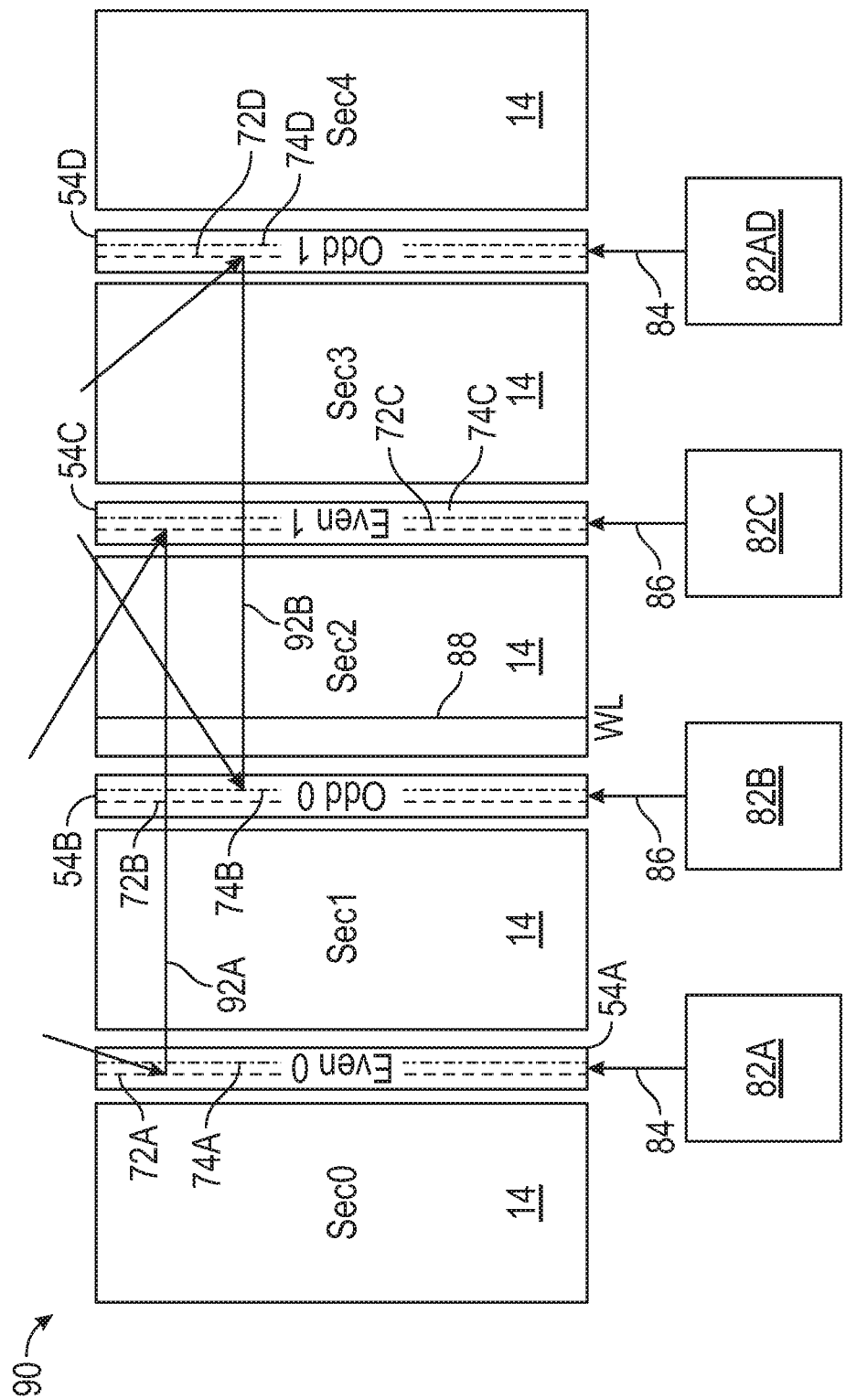
FIG. 4 is a diagram illustrating an arrangement for a memory bank having shared pull-down circuitry, in accordance with an embodiment.

While block diagram 70 in FIG. 3 illustrates a system with a shared common source pull-up connection, block diagram 90 in FIG. 4 illustrates a system with a shared common source pull-down connection. The block diagram 90 has memory banks 14A, 14B, 14C, 14D, and 14E that are coupled to adjacent SA stripes 54A, 54B, 54C, and 54D. Memory banks 14A, 14B, 14C, 14D, and 14E are also coupled to SWD blocks, which are omitted in the diagram for clarity. In the illustrated system, each SA stripe (e.g., SA stripes 54A, 54B, 54C, and 54E) may include a pull-up line (e.g., SAPCS lines 72A, 72B, 72C, and 72D) and a pull-down line (e.g., SANCS lines 74A, 74B, 74C, and 74D). The drivers of pull-down lines from different SA stripes may be shared. To that end, a connection 92A may couple the SANCS line 74A of the SA stripe 54A to the SANCS line 74C of the SA stripe 54C. Similarly, a connection 92B may couple the SANCS line 74B of the SA stripe 54B to the SANCS line 74D of the SA stripe 54D. As a result, the pull-down SANCS lines 74A and 74C are activated together to pull down the driving circuitries (e.g., transistors devices) in both SA stripes 54A and 54C, and the pull-down lines 74B and 74D are activated together and to pull down the driving circuitries (e.g., transistor devices) in both SA stripes 54B and 54D.

As discussed above, a single memory bank (e.g., memory banks 14A, 14B, 14C, 14D, or 14E) is generally active during an activate operation. In the illustrated system, data row 88 in memory bank 14C is being activated for an activate operation by SWD circuitry (not illustrated), as an example. In such a situation, the active SA circuit may be activated to read data from the active memory bank. In this example, the pull-down lines 74B and 74C may be activated to enable SA circuitry in the active SA stripes 54B and 54C. However, as discussed above, pull-down lines 74A and 74D may be activated due to the presence of connections 92A and 92B, respectively. It should be noted that the connections 80A-D and 92A-D, describe above, may refer to electrical connectors or electrical coupling elements that may be implemented using conductive traces and/or conductive wires.

As with the memory bank illustrated in FIG. 3, switching circuitry within SA stripes 54A and 54D may be used to disconnect the pull-down devices from the data lines, to prevent the idle SA stripes 54A and 54D from generating undesired output. Control logic may coordinate the switching circuitry and the pull-down lines in this system. In the illustrated example, logic blocks 82A, 82B, 82C, and 82D control the SA stripes 54A, 54B, 54C, and 54D, respectively. Control command 84 may be provided to switching circuitry in SA stripes 54A and 54D to disconnect the SA amplifiers from the data lines, whereas control command 86 may be provided to switching circuitry in stripes 54B and 54C to connect the SA amplifiers from the data lines. It should be understood that the illustrated logic blocks may be implemented by multiple independent logic circuits or by a single logic circuit.

The systems illustrated in the FIGS. 3 and 4 share driving circuitry between two non-adjacent SA stripes. In some embodiments, the driving circuitry of more than two non-adjacent SA stripes may be shared. For example, 4 or 8 SA pull-up lines 72 or pull-down lines 74 may be connected and may share the driving devices (e.g., transistor). The number of SA stripes that are grouped in this manner may be limited by the metal resistance limits and/or the distances between the SA stripes of a particular group.

Figure 5:
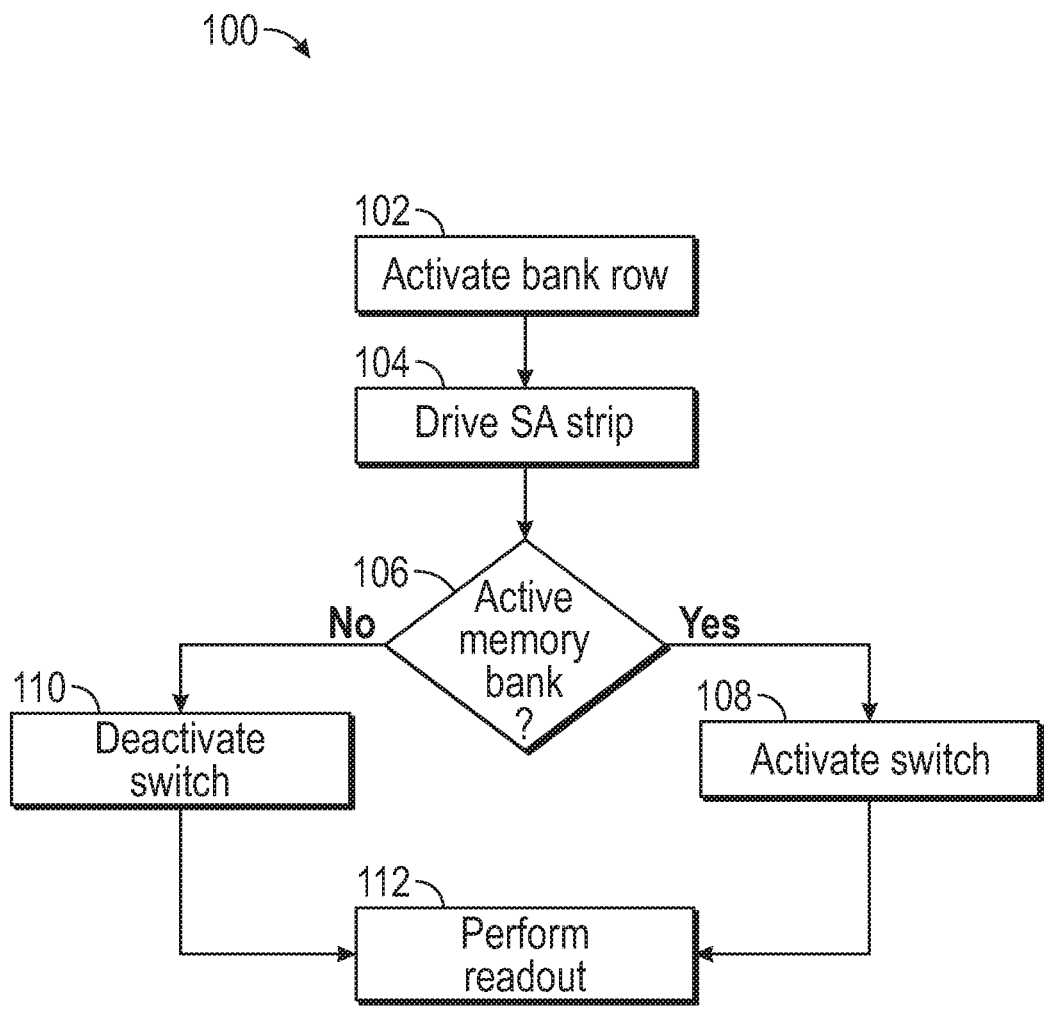
FIG. 5 is a flow chart for a method that may be implemented in control and/or logic circuitry to perform operations in memory banks with shared driver circuitry, in accordance with an embodiment.

The flow chart 100 in FIG. 5 illustrates a method for a controller to perform operations using the above-discussed memory devices with shared driving circuitry. The process may be implemented by logic circuitry that controls the SA circuitry for multiple memory banks, in response to an activate operation. In an initial process box 102, the controller may receive a command to activate a bank row in an active memory bank. The bank row may be activated by SWD circuitry or any other suitable circuit in response to the command. In some embodiments, a memory address may be used to perform the row activation.

In a process box 104, the controller may receive a command to activate the active SA stripes that are adjacent to the active memory bank. The command may include the activation of pull-up lines and of pull-down lines in the active SA stripes. The activation of driving circuitry in the active SA stripes, pull-up and/or pull-down lines of idle SA stripes that share driving circuitry with the active stripe may be activated, as discussed above. In decision box 106, the controller may determine if a SA stripe is adjacent to the active memory bank. If the SA stripe is adjacent to the active memory bank (i.e., active SA strip), the switching circuitry may be activated to connect the SA circuitry to the data lines in process box 108. If the SA stripe is not adjacent to the active memory bank (i.e., idle SA strip), the switching circuitry may be deactivated to disconnect the SA circuitry from the data lines in process box 110. The SA stripes may perform the readout, and provide read access to the activated bank row in process 112.

Figure 6:
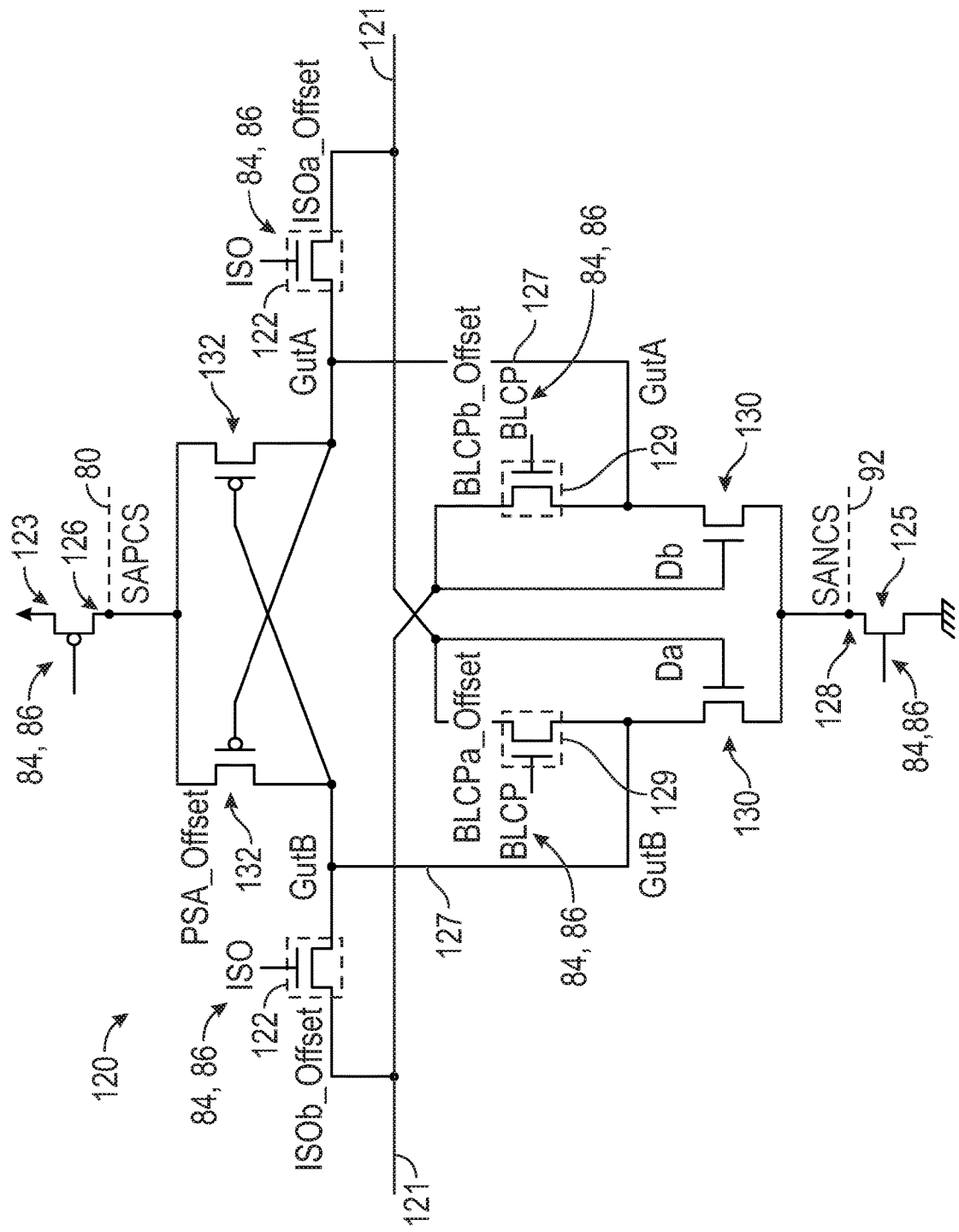
FIG. 6 is a circuit diagram of sense amplifying circuitry with switching circuitry and shared driver circuitry, in accordance with an embodiment.

FIG. 6 illustrates a cross-coupled SA circuit 120 that may be used in any of the SA stripes or circuitries discussed above. In general, an SA stripe such as the ones illustrated above, may have one or more cross-coupled SA circuits 120, with each cross-coupled SA circuit 120 being used to assist the readout of one or multiple rows. To that end, the SA circuit 120 may sense variations in the voltage of the data lines 121 and drive the voltage of the data line 121 to perform a read-out. The cross-coupled design of SA circuit 120 also includes switching circuitry that can perform bias voltage compensation (i.e., Vt compensation) and may be used in any of the SA stripes above-discussed. The switching circuitry may include the matched isolation (ISO) devices 122 and the matched bit-line CP compensation (BLCP) devices 124. The P-channel common source device 123 may be used to pull-up the SA circuit 120. The N-channel common source device 125 may be used to pull-down the SA circuit 120. Activation of the P-channel common source device 123 and of the N-channel common source device 125 may be performed by a controller (e.g., through control commands 84 and/or 86).

The SA circuit 120 illustrated in FIG. 6, may be placed in an active configuration by activating the switching devices 122 and 124. Activation of the switching devices may be performed by a controller (e.g., through control command 84 and/or 86). When the switching devices 122 and 124 are active, Vt mismatch in devices 130 is compensated. The data lines may sense the memory cell content using devices 130 and/or 132 and be driven to the voltage level that corresponds to the memory cells content (e.g., the pull-down voltage when the bit '0' is stored, the pull-up voltage when the bit '1' is stored) by the driving circuitry and using the P-channel common source device 123 or the N-channel common source device 125.

The SA circuit 120 may be placed in an idle configuration by deactivating the switching devices 122 and 124. Deactivation of the switching devices 122 and 124 may be performed by a controller (e.g., through control commands 84 and/or 86) to prevent the SA circuit 120 from driving the data line even when the common source devices 123 or 125 are deactivated. When the switching devices 122 and 124 are deactivated, the internal nodes 127 may be pulled-up or pulled-down based on the activation of the common source device. Since the switching devices 122 and 124 are deactivated, the data lines 121 remain capacitive and, thus, unaffected by pull-up from the common source device 123 or by a pull-down from the common source device 125. As a result, the P-channel common source device 123 and/or the N-channel common source device 125 may be activated to provide driving capacity to another SA circuit that shares the driving circuitry, without affecting the data lines 121. As discussed above, multiple SA stripes may be coupled to each other through nodes 80 and 92 to share the driving circuitry. To that end, nodes 80 and/or 92 may be used to couple two different SA circuits 120 in corresponding SA stripes. Moreover, in order to provide coordinated activation between SA circuits 120 within the stripes, nodes 80 and 92 may also be connected among SA circuits 120 within a single stripe.

Embodiments of the specification discussed herein may facilitate reduction of the dimensions of sense-amplifying circuitry in memory devices without substantial reduction of the driving capacity and/or data readout. The discussed embodiments may also have a faster memory cell restore time, which may increase the speed of operation of the memory device. The use of the above-discussed switching circuitry may facilitate reduction by allowing the sharing of multiple voltage driving devices between sense amplifying circuits. In some embodiments, the switching circuitry may also be used to compensate voltage offset that may be associated with cross-coupled sense amplifier design.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. An apparatus comprising:
   a first memory cell array;
   a first sense amplifying block, comprising first driving circuitry, wherein the first sense amplifying block is adjacent to the first memory cell array, and wherein the first sense amplifying block comprises a data line coupled to the first memory cell array; and
   a second sense amplifying block, comprising second driving circuitry, wherein the second sense amplifying block is not adjacent to the first memory cell array wherein the first driving circuitry and the second driving circuitry are directly coupled by an electrical connector.

2. The apparatus of claim 1, comprising logic circuitry configured to:
   receive a signal associated with a command to read data from the first memory cell array;
   provide a first control signal that activates the first sense amplifying block; and
   provide a second control signal that deactivates the second sense amplifying block.

3. The apparatus of claim 2, wherein the first sense amplifying block comprises first switching circuitry, the second sense amplifying block comprises second switching circuitry, the first control signal activates the first switching circuitry and the second control signal deactivates the second switching circuitry.

4. The apparatus of claim 3, wherein the first switching circuitry is configured to performs threshold voltage compensation.

5. The apparatus of claim 3, wherein the first switching circuitry comprises a first transistor device disposed between the first driving circuitry and the data line coupled to the first memory cell array.

6. The apparatus of claim 2, wherein the first control signal activates the first driving circuitry and the second control signal activates the second driving circuitry.

7. The apparatus of claim 1, wherein the electrical connector causes the first driving circuitry and the second driving circuitry to be disposed in parallel.

8. The apparatus of claim 1, wherein the first driving circuitry comprises a pull-up transistor, and wherein the electrical connector is coupled to a drain of the pull-up transistor.

9. The apparatus of claim 8, wherein the pull-up transistor comprises a p-type metal-oxide semiconductor (PMOS) transistor.

10. The apparatus of claim 1, comprising a third sense amplifying block, comprising third driving circuitry, wherein the third sense amplifying block is adjacent to the first memory cell array and wherein the first driving circuitry and the third driving circuitry are decoupled from each other.

11. The apparatus of claim 1, comprising a third sense amplifying block, comprising third driving circuitry, wherein the third sense amplifying block is not adjacent to the first memory cell array and wherein the first driving circuitry, the second driving circuitry and the third driving circuitry are directly coupled by the electrical connector.

12. A memory device, comprising:
    a first memory cell array; and
    a plurality of sense amplifying (SA) stripes, each respective SA stripe comprising respective driving circuitry configured to drive respective sense amplifying (SA) circuitry of the SA stripe and respective switching circuitry configured to connect the SA circuitry of the SA stripe to a data line of the SA stripe; and
    wherein the first memory cell array is configured to couple to a first SA stripe of the plurality of SA stripes, and wherein first driving circuitry of the first SA stripe of the plurality of SA stripes is connected to second driving circuitry of a second SA stripe of the plurality of SA stripes that is not coupled to the first memory cell array.

13. The memory device of claim 12, wherein each driving circuitry comprises a respective pull-up transistor.

14. The memory device of claim 13, wherein a drain terminal of a first pull-up transistor of the first driving circuitry is coupled to a drain terminal of a second pull-up transistor of the second driving circuitry.

15. The memory device of claim 12, comprising a control logic configured to:
receive a read command comprising an address associated with a memory cell disposed in the first memory cell array;
provide a first command to the first SA stripe to activate the first driving circuitry and to activate first switching circuitry of the first SA stripe; and
provide a second command to the second SA stripe to activate the second driving circuitry and to deactivate second switching circuitry of the second SA stripe.

16. The memory device of claim 15, wherein the first switching circuitry is configured to compensate a threshold voltage bias.

17. An apparatus comprising:
first, second, third and fourth memory cell arrays arranged in a first direction;
a first sense amplifier (SA) stripe arranged between the first and the second memory cell arrays, wherein the first SA stripe comprises at least one first sense amplifying block and a first voltage node coupled to the at least one first sense amplifying block;
a second SA stripe arranged between the second and the third memory cell arrays, wherein the second SA stripe comprises at least one second sense amplifying block and a second voltage node coupled to the at least one second sense amplifying block;
a third SA stripe arranged between the third and fourth memory cell arrays, wherein the third SA stripe comprises at least one third sense amplifying block and a third voltage node coupled to the at least one third sense amplifying block; and
a first electrical connector connected between the first voltage node of the first SA stripe and the third voltage node of the third SA stripe, and decoupled from the second voltage node.

18. The apparatus of claim 17, further comprising:
a fifth memory cell array arranged such that the fourth memory cell array is arranged between the third and fifth memory cell arrays;
a fourth SA stripe arranged between the fourth and fifth memory cell arrays, the fourth SA stripe including at least one fourth sense amplifying block and a fourth voltage node coupled to the at least one fourth sense amplifying block; and
a second electrical connector connected between the second voltage node of the second SA stripe and the fourth voltage node of the fourth SA stripe, and decoupled from the first and the third voltage nodes.

19. The apparatus of claim 17, wherein the first electrical connector elongates over the second and third memory cell arrays.

20. The apparatus of claim 17, wherein the first SA stripe comprises a fourth voltage node coupled to the at least one first sense amplifying block, the second SA stripe comprises a fifth voltage node coupled to the at least one second sense amplifying block, the third SA stripe comprises a sixth voltage node coupled to the at least one third sense amplifying block, and the apparatus comprises a second electrical connector connected between the fourth voltage node and the sixth voltage node, and decoupled from the fifth voltage node.

* * * * *